(12) United States Patent
Sekine

(10) Patent No.: US 7,683,490 B2
(45) Date of Patent: Mar. 23, 2010

(54) SEMICONDUCTOR INTEGRATED CIRCUIT AND SEMICONDUCTOR DEVICE HAVING MULTILAYER INTERCONNECTION

(75) Inventor: Junichi Sekine, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 358 days.

(21) Appl. No.: 11/612,840

(22) Filed: Dec. 19, 2006

(65) Prior Publication Data

US 2007/0138645 A1 Jun. 21, 2007

(30) Foreign Application Priority Data

Dec. 21, 2005 (JP) ............................ 2005-368635

(51) Int. Cl.
  *H01L 23/48* (2006.01)
(52) U.S. Cl. ............................ 257/774; 257/E23.001
(58) Field of Classification Search ................ 257/202, 257/203, 207, 208, 211, E23.142, E23.143, 257/E23.144, E23.145, E23.146, E23.151, 257/E23.153, 774, E23.001, E23.141
  See application file for complete search history.

(56) References Cited

U.S. PATENT DOCUMENTS

| 5,014,110 | A | * | 5/1991 | Satoh | ............... | 257/776 |
|---|---|---|---|---|---|---|
| 5,534,732 | A | * | 7/1996 | DeBrosse et al. | ............ | 257/776 |
| 5,670,815 | A | * | 9/1997 | Childs et al. | ................ | 257/386 |
| 5,864,181 | A | * | 1/1999 | Keeth | ......................... | 257/776 |
| 5,894,142 | A | * | 4/1999 | Fiduccia et al. | ............. | 257/207 |
| 6,229,186 | B1 | * | 5/2001 | Ishida | ......................... | 257/390 |
| 6,806,738 | B2 | * | 10/2004 | Kokubo et al. | .............. | 326/101 |
| 6,858,928 | B1 | * | 2/2005 | Teig et al. | .................... | 257/700 |
| 7,505,321 | B2 | * | 3/2009 | Scheuerlein et al. | ... | 365/185.17 |
| 7,514,355 | B2 | * | 4/2009 | Katase et al. | ............... | 438/637 |
| 2003/0089868 | A1 | * | 5/2003 | Ito et al. | ..................... | 251/100 |

FOREIGN PATENT DOCUMENTS

| JP | 3-19257 A | 1/1991 |
|---|---|---|
| JP | 2001-168195 A | 6/2001 |

\* cited by examiner

*Primary Examiner*—Thao P. Le
(74) *Attorney, Agent, or Firm*—Sughrue Mion, PLLC

(57) ABSTRACT

A semiconductor device includes: multi-layer interconnection substrate having signal distribution interconnection and power supply line; and semiconductor circuit blocks installed on the multi-layer interconnection substrate for performing required operations. The multi-layer substrate includes: a third interconnection layer having interconnections extending in a first direction; a second interconnection layer having interconnections extending in a second direction which is different to the first direction; and a first interconnection layer having interconnections extends in a direction orthogonal to the first direction.

12 Claims, 8 Drawing Sheets

500: FIFTH INTERCONNECTION LAYOUT

- ▨ 20E: FIRST INTERCONNECTION LAYER
- ▧ 10E: SECOND INTERCONNECTION LAYER
- ▦ 30E: THIRD INTERCONNECTION LAYER
- ■ 50E: CONTACT CONNECTING SECOND AND THIRD INTERCONNECTION LAYER
- ▭ 60: CIRCUIT BLOCK

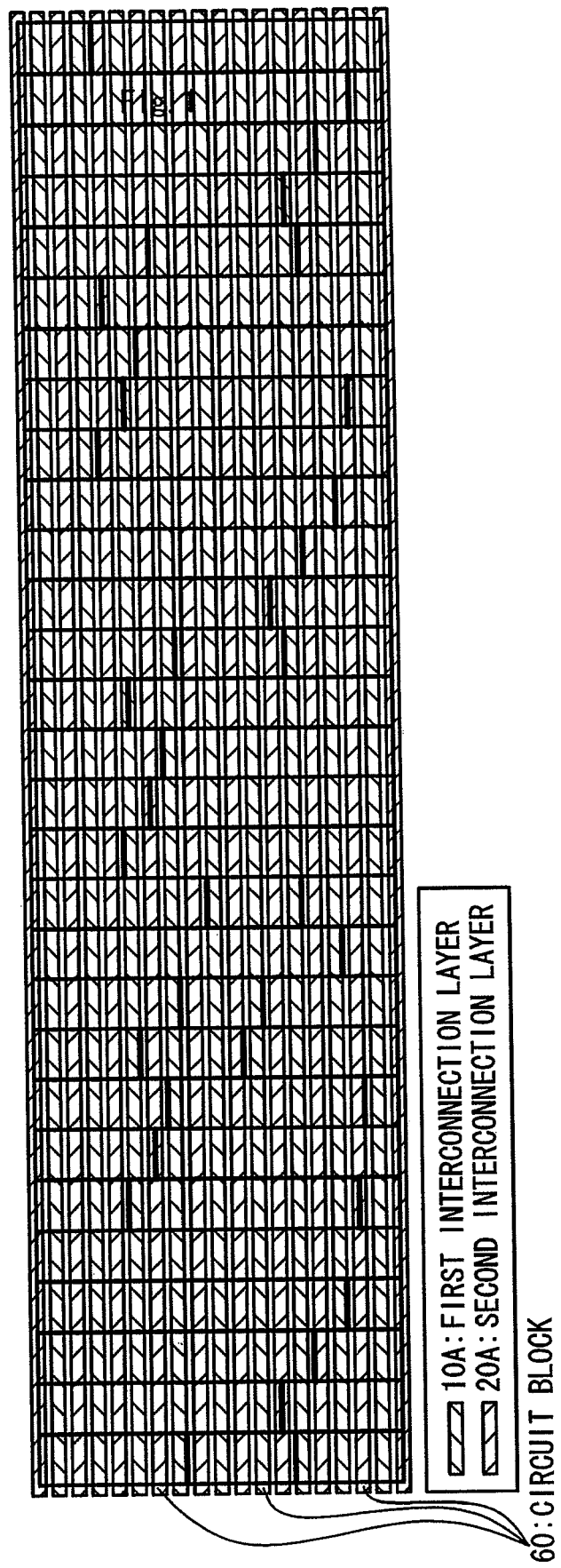

300: THIRD INTERCONNECTION LAYOUT

10C: FIRST INTERCONNECTION LAYER
20C: SECOND INTERCONNECTION LAYER
30C: THIRD INTERCONNECTION LAYER
50C: CONTACT CONNECTING SECOND AND THIRD INTERCONNECTION LAYER
60: CIRCUIT BLOCK

400: FOURTH INTERCONNECTION LAYOUT

10D: FIRST INTERCONNECTION LAYER
20D: SECOND INTERCONNECTION LAYER
30D: THIRD INTERCONNECTION LAYER
50D: CONTACT CONNECTING SECOND AND THIRD INTERCONNECTION LAYER
60: CIRCUIT BLOCK

500: FIFTH INTERCONNECTION LAYOUT

SEMICONDUCTOR INTEGRATED CIRCUIT AND SEMICONDUCTOR DEVICE HAVING MULTILAYER INTERCONNECTION

BACKGROUND OF THE INVENTION

1. Field of the Invention

The present invention relates to a semiconductor integrated circuit and a semiconductor device having multi-layer interconnection.

2. Description of the Related Art

Recently, the functions and processing speed of semiconductor devices have been enhanced so that the number of signal lines included in a multi-layer interconnection semiconductor integrated circuit contained in the semiconductor device has been increased. The number of interconnection layers in the multi-layer interconnection semiconductor integrated circuit may be added for increasing the number of signal lines in the multi-layer interconnection semiconductor integrated circuit. However, for suppressing the manufacturing cost, the number of the interconnection layers to be added is desired to be small.

In the case that an interconnection layer is additionally laminated (stacked) on a conventional multi-layer substrate, if the added interconnection layer has interconnections extending in the same direction as the interconnections formed in the interconnection layer laid immediately below, an interconnections formed in the added interconnection layer and an another interconnection formed in the interconnection layer laid below may overlap with each other in vertical direction, such as a first interconnection layer 10 and a second interconnection layer 20 as shown in FIG. 1. If the overlapping area between the interconnections in the interconnection layers adjacent to each other in the vertical direction is large, the coupling capacitance between the interconnections is also large, and the signals flowing through the respective interconnections have the effects of the couplings (electromagnetic couplings) on each other. As a result, noises are added to both of the signal lines, and erroneous operations are occurred in the semiconductor device having the multi-layer interconnection semiconductor integrated circuit.

For suppressing the coupling capacitance as mentioned above, a method is proposed in which the interconnections in an upper interconnection layer is arranged to be shifted by a half pitch from the interconnections formed in the lower adjacent interconnection layer. FIG. 2A shows the schematic sectional view of the interconnections, and FIG. 2B shows the planar view of the interconnections formed in the upper and lower interconnection layers from the top surfaces of the overlapping interconnection layers. In this method, since the coupling capacitance between the upper and lower interconnection layers are reduced, the noise contained in the signal transmitted through each interconnection is relatively reduced. However, even in the case of this method, as the length of the interconnection in the transmission direction of the signal is increased, the coupling capacitance as the multi-layer interconnection semiconductor integrated circuit becomes larger.

So, in order to further reduce the coupling capacitance in the multi-layer interconnection semiconductor integrated circuit, a method that enlarges the design value of the pitch between the interconnections formed in the same layer for both of the adjacent interconnection layers is proposed. FIG. 3A shows the schematic sectional view of the interconnections, and FIG. 3B shows the planar view of the interconnections formed in the upper and lower interconnection layers from the top surfaces of the interconnection layers. In this proposal, the coupling capacitance per unit length between the interconnections is further reduced as compared with those shown in FIGS. 2A, 2B. However, it is difficult to avoid the fact that as the length of the interconnection in the transmission direction of the signal is increased, the coupling capacitance of the multi-layer interconnection semiconductor integrated circuit becomes larger.

The following techniques are also disclosed.

In Japanese Laid Open Patent Application (JP-A-Heisei, 3-19257), a semiconductor integrated circuit device, in which a plurality of circuit blocks whose signal amplitudes are different are installed in a same semiconductor substrate is disclosed. In this semiconductor device, among signal interconnections for connecting between the circuit blocks, at least a part of the signal interconnections to transmit electric signals of small signal amplitudes is extended obliquely for the interconnection channel direction of the signal interconnection to transmit an electric signal of a large signal amplitude.

Also, a multi-layer interconnection semiconductor integrated circuit is disclosed in Japanese Laid Open Patent Application (JP-P 2001-168195A). The multi-layer interconnection semiconductor integrated circuit has an interconnection structure of at least 6 layers, wherein the interconnections of the first and second layers are formed on an orthogonal grid so as to be orthogonal to each other. Assumed that the unit pitch of the interconnections of the first and second layers are a, b, respectively, and n, m are even numbers of 2 or more, respectively, and an angle equal to arctangent (na/mb) is θ. Then, the interconnection of the third layer is formed on the oblique grid so as to be inclined in a +θ direction with respect to the interconnection of the first or second layer, and the interconnection of the fourth layer is formed on the oblique grid so as to be inclined in a −θ direction with respect to the interconnection of the first or second layer. And assumed that the unit pitch of the interconnections of the third and fourth layers are c, d, respectively, $c=d=na \times mb/\{(na)2+(mb)2\}½$, and all of the intersections of the interconnections of the third and fourth layers are located at the positions overlapping with the intersections of the orthogonal grid of the interconnections of the first and second layers, and the interconnections of the fifth and sixth layers are formed on the roughly orthogonal grids constituting the partial sets of the orthogonal grids of the interconnections of the first and second layers. And assumed that the unit interconnection pitches of the fifth and sixth layers are e, f, respectively, e=na and f=mb, and all of the intersections of the interconnections of the fifth and sixth layers are located at the positions overlapping with the intersections of the inclination grids of the interconnections of the third and fourth layers.

SUMMARY OF THE INVENTION

It is therefore an object of the present invention to provide a semiconductor integrated circuit and semiconductor device having multi-layer interconnections, in which a coupling capacitance between the interconnection layers adjacent to each other is reduced and the areas of the interconnection layers are suppressed.

In an aspect of the present invention, a multi-layer interconnection semiconductor integrated circuit includes: a semiconductor circuit block; and a multi-layer interconnection substrate for supplying data and power to the semiconductor circuit block. The multi-layer interconnection substrate includes: a first interconnection layer having a plurality of first interconnections which extends in a first direction in a certain area; and a second interconnection layer formed on the first interconnection layer and having a plurality of second interconnections which extend in a second different to the first direction in an area overlapping to the certain area.

Preferably, the second interconnection layer has a first portion and second portion. Both of the first and second portions are placed in an area overlapping to the certain area. The second interconnections extend in the first direction in the first portion, and extend in the second direction in the second portion.

More preferably, the second interconnection layer has a first portion and second portion both of which are placed in an area overlapping to the certain area, and the second interconnections extends in the first direction in the first portion, and extends in the second direction orthogonal to the first direction in the second portion.

The multi-layer interconnection semiconductor integrated circuit according the present invention further includes: a third interconnection layer formed on the second interconnection layer and including a plurality of third interconnections extending in a direction orthogonal to the first direction, wherein the plurality of third interconnections electrically connect both ends in a direction orthogonal to the first direction of the second interconnections.

Preferably, the third interconnections contain tungsten.

The plurality of second interconnections are suitable for the use as a data bus and an address bus.

The semiconductor circuit block is electrically connected to the first interconnections.

In another aspect of the present invention, a semiconductor device includes: a plurality of semiconductor circuits; a signal inputting unit; a power unit; and a multi-layer interconnection substrate according to the present invention.

According to the present invention, it is possible to provide a semiconductor integrated circuit and semiconductor device having a multi-layer interconnection structure, in which the coupling capacitances between the interconnection layers are reduced and the increase of the area of the interconnection layers is suppressed.

In particular, in the semiconductor integrated circuit and semiconductor device having multi-layer interconnections according to the present invention, an interconnection formed in a layer and an another interconnection formed in an adjacent layer are not overlapped from the viewpoint of the direction normal to the interconnection layers over a large length for the transmission direction of signals transmitted through the interconnections. Thus, the coupling capacitances between the stacked interconnection layers are reduced. Hence, the noises contained in signals transmitted through respective interconnections are reduced, which can prevent in advance the semiconductor device having the multi-layer interconnection layers from the erroneous operation.

BRIEF DESCRIPTION OF THE DRAWINGS

FIG. 2B is a transparent planar view showing the configuration of the interconnection layout including interconnections formed in interconnection layers;

DESCRIPTION OF THE PREFERRED EMBODIMENTS

The embodiments of a semiconductor integrated circuit and a semiconductor device having multi-layer interconnections according to the present invention will be described below with reference to the attached drawings.

The multi-layer interconnection semiconductor integrated circuit according to the first embodiment of the present invention includes: multi-layer interconnection substrate having signal interconnections and a power source supply interconnection; and a semiconductor circuit blocks that are placed on the multi-layer interconnection substrate for implementing appropriate operations.

Figure 1:
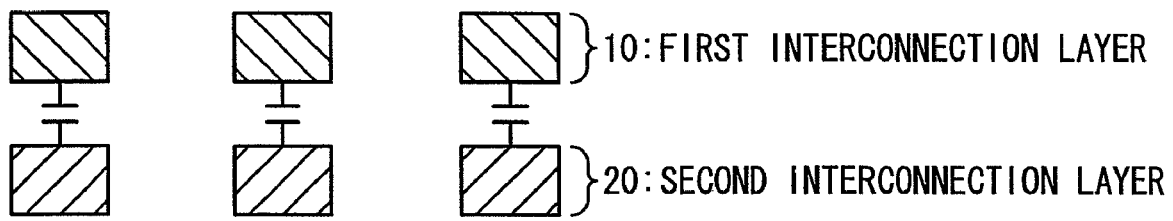
FIG. 1 is a view showing a schematic sectional view (shown in the direction of interconnection section) of an interconnection layout, in a conventional multi-layer interconnection semiconductor integrated circuit.
Figure 2A:
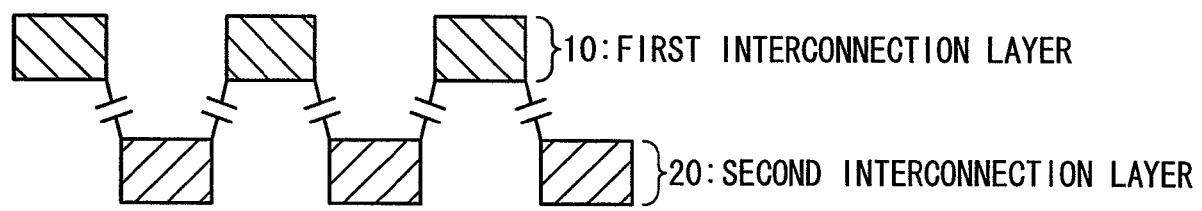
FIG. 2A is a view showing a schematic sectional view (shown in the direction of interconnection section) of an interconnection layout, in a conventional multi-layer interconnection semiconductor integrated circuit.
Figure 3A:
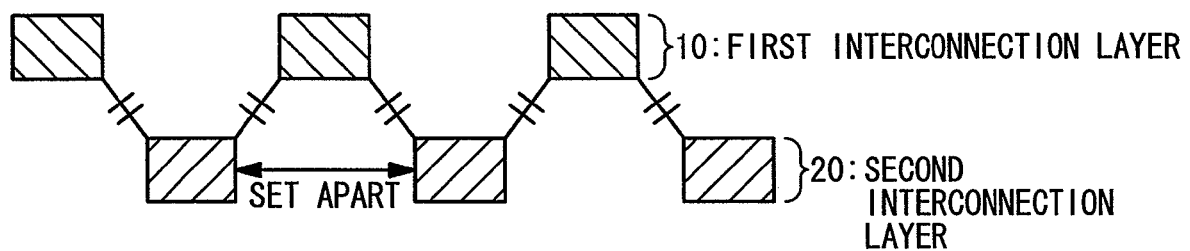
FIG. 3A is a view showing a schematic sectional view (shown in the direction of interconnection section) of the interconnection layout, in a conventional multi-layer interconnection semiconductor integrated circuit.
Figure 3B:
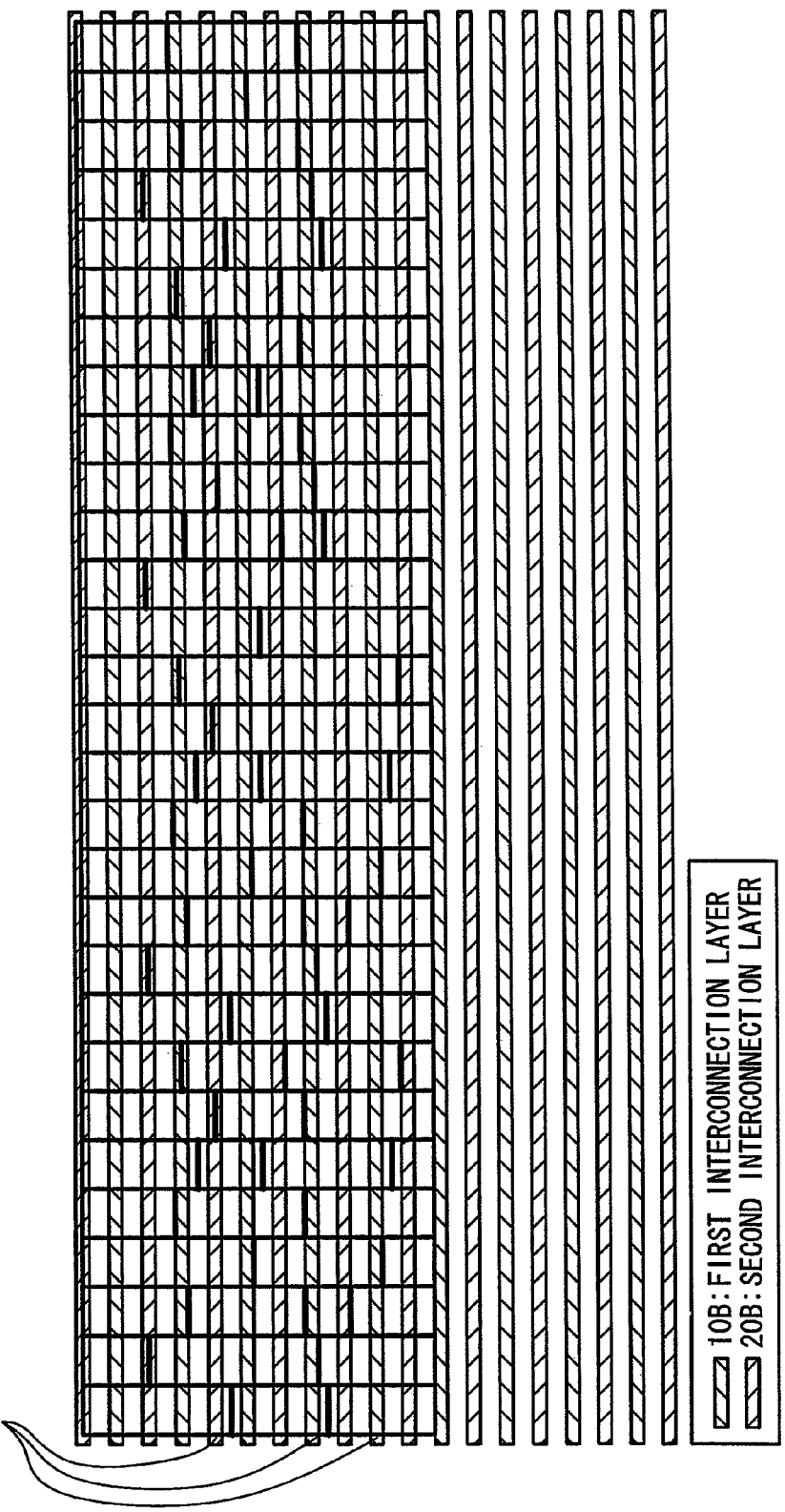
FIG. 3B is a transparent planar view showing the configuration of the interconnection layout including interconnections formed in interconnection layers.
Figure 4:
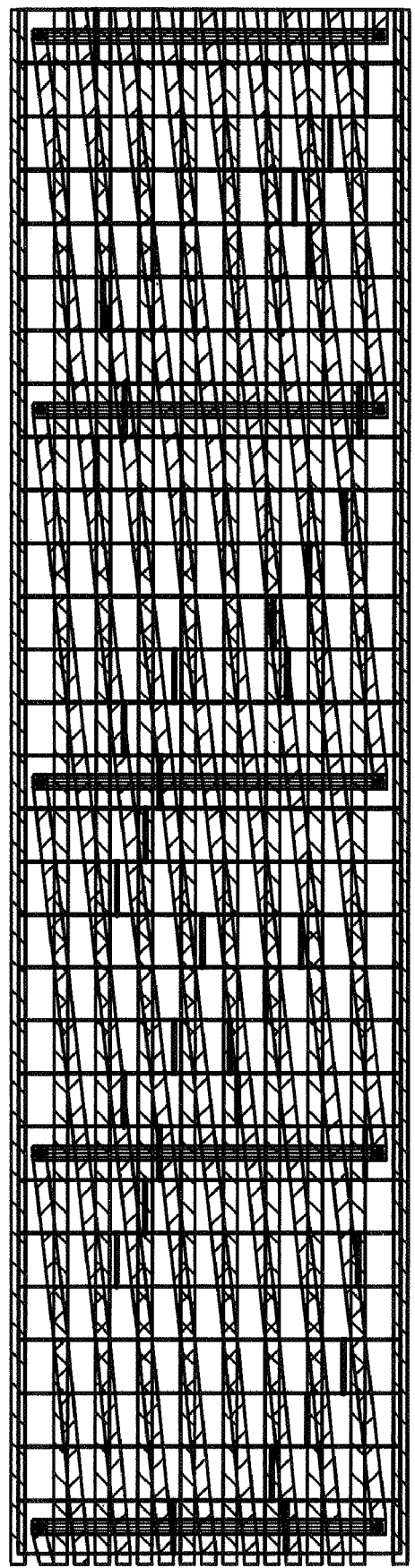
FIG. 4 is a transparent planar view of the configuration of the interconnection layout including interconnections formed in interconnection layers, in the multi-layer interconnection semiconductor integrated circuit according to the first embodiment.

FIG. 4 shows a transparent planar view of the third interconnection layout 300 including the interconnections formed in the interconnection layers of the multi-layer interconnection substrate. As demonstrated in the interconnection layout 300, the multi-layer interconnection substrate in this embodiment includes: a first interconnection layer 10C having interconnections extending in a first direction; a second interconnection layer 20C which is laminated on the first interconnection layer 10C and includes interconnections extending in a second direction that are set to be different to the first direction; and a third interconnection layer 30C which is laminated on the second interconnection layer 20C and has interconnections extending in the direction orthogonal to the first direction.

The interconnections formed in the third interconnection layer 30C electrically connect the both ends in the direction orthogonal to the first direction of the interconnections formed in the second interconnection layer 20C through via holes 50C.

Also, in the multi-layer interconnection semiconductor integrated circuit according to this embodiment, circuit blocks 60 for performing appropriate functions are installed on the third interconnection layer 30C. Since input/output terminals of each of the circuit blocks and the interconnections formed on the third interconnection layer 30C are electrically connected, the interfaces for the electrical signal and the power source current are established between the circuit blocks and the multi-layer interconnection substrate including the third interconnection layer 30C. For this reason, in the multi-layer interconnection semiconductor integrated circuit according to this embodiment, in particular, each of the interconnections formed in the second interconnection layer 20C is suitable for the use as a data bus (I/O bus) or an address bus.

One of the circuit blocks 60 is served as a power unit. The power unit supplies electrical power to the other circuit blocks 60 through the first or second interconnection. Also, one of the circuit blocks 60 is served as a signal inputting unit. The signal inputting unit supplies electronic signals to the other circuit blocks 60 through the first of second interconnection.

Also, the conductive material forming the interconnections in each interconnection layer of the multi-layer interconnection substrate is made of metal. In particular, tungsten is optimal for the interconnections in the third interconnection layer 30C, and aluminum or copper is optimal for the interconnections in the first interconnection layer 10C or the second interconnection layer 20C, as the conductive material of the respective interconnections.

As mentioned above, in the multi-layer interconnection semiconductor integrated circuit according to this embodiment, the second interconnections are formed to be extended in the direction different to the interconnections in the first interconnection layer 10C extending in the first direction. Further, the interconnections formed in the third interconnection layer 30C are formed to extend in the direction orthogonal to the first direction.

Consequently, according to this embodiment, the area of the sterically overlapping portions between the interconnections formed in the first interconnection layer 10C and the second interconnection layer 20C, which are mainly used as the signal lines and the power source supply lines, is reduced, so that the coupling capacitance is suppressed. Then, it is possible to reduce the noises contained in the signals transmitted through the interconnections in the interconnection layers and to prevent in advance the multi-layer interconnection semiconductor integrated circuit from the erroneous operation.

Figure 5:
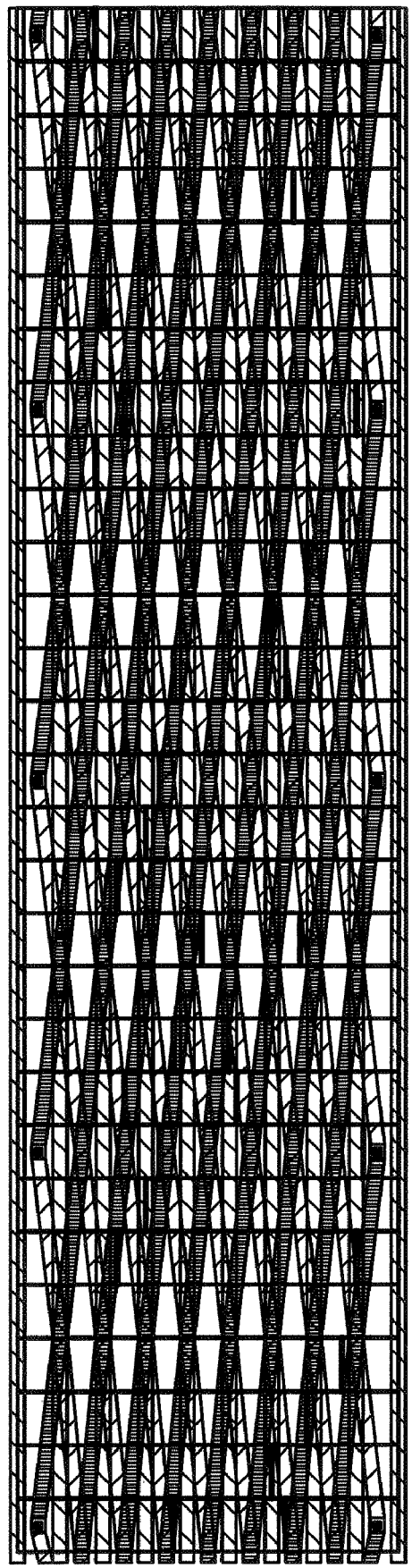
FIG. 5 is a transparent planar view showing the configuration of the interconnection layout including interconnections formed in interconnection layers, in a multi-layer interconnection semiconductor integrated circuit.

In this embodiment, in particular, the interconnections formed in the third interconnection layer 30C are formed along the direction orthogonal to the first direction. If the angle between the group of interconnections in the third interconnection layer 30D and the direction orthogonal to the first direction (the extending direction of the interconnections in the first interconnection layer) is large as in the fourth interconnection layout 400 shown in FIG. 5, it is relatively difficult to reserve the space for the electric connection between the circuit blocks 60 installed on the third interconnection layer 30C and the interconnections formed on the third interconnection layer 30C.

Also, the interconnections formed in the third interconnection layer 30C electrically connect the ends located at both ends in the direction orthogonal to the first direction of the interconnections formed in the second interconnection layer 20C through via holes. Hence, even if each of the interconnections formed in the second interconnection layer 20C is formed along the direction different to the first direction, it is possible to prevent the interconnections formed in the second interconnection layer 20C from occupying larger size in the direction orthogonal to the first direction and consequently possible to suppress the area of the interconnection layers.

Next, a multi-layer interconnection semiconductor integrated circuit according to the second embodiment of the present invention is explained. The basic configuration of the multi-layer interconnection semiconductor integrated circuit according to the second embodiment of the present invention is similar to that of the first embodiment.

Figure 6:
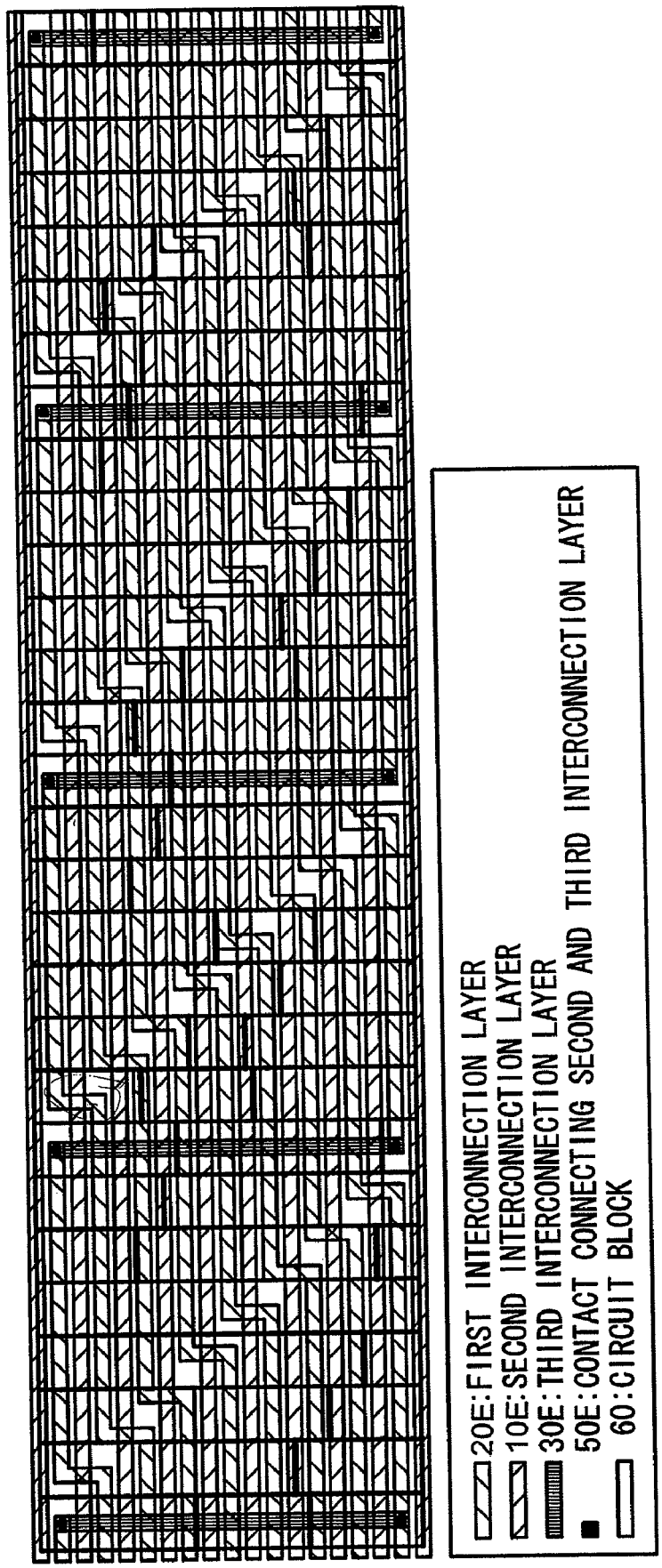
FIG. 6 is a transparent planar view showing the configuration of the interconnection layout including interconnections formed in interconnection layers, in a multi-layer interconnection semiconductor integrated circuit according to the second embodiment.

FIG. 6 shows the transparent planar view of the fifth interconnection layout 500 including the interconnections formed in the interconnection layers of the multi-layer interconnection substrate contained in this embodiment. As demonstrated in the fifth interconnection layout 500, the multi-layer interconnection substrate includes: a first interconnection layer 10E having interconnections extending in a first direction; a second interconnection layer 20E laminated on the first interconnection layer 10E and has interconnections with a staircase shape in which a second portion formed along a second direction orthogonal to the first direction and a first portion in which the interconnections extends in the first direction are alternately connected; and a third interconnection layer 30E which is laminated adjacently to the second interconnection layer 20E and contains interconnections formed along the direction orthogonal to the first direction.

Each of the interconnections formed in the third interconnection layer 30E electrically connects the ends located at both ends in the direction orthogonal to the first direction of the interconnections formed in the second interconnection layer 20E through via holes 50E.

Also, in the multi-layer interconnection semiconductor integrated circuit according to this embodiment, the circuit blocks 60 for operating the required functions are installed on the third interconnection layer 30C. The input/output terminals of the circuit blocks and the interconnections formed in the third interconnection layer 30E are electrically connected and the interfaces of the electrical signal and the power source current are established between the circuit blocks 60 and the multi-layer interconnection substrate including the third interconnection layer 30E. For this reason, in the multi-layer interconnection semiconductor integrated circuit according to this embodiment, in particular, each of the interconnections formed in the second interconnection layer 20E is suitable for the use as a data bus (I/O) or an address bus. Also, the conductive material forming the interconnections on each interconnection layer of the multi-layer interconnection substrates are made of metal. Particularly, tungsten is optimal for the interconnection formed on the third interconnection layer 30E, and aluminum or copper is optimal for the interconnection formed in the second interconnection layer 20E or the first interconnection layer 10E, as the conductive material.

As mentioned above, in addition to the interconnections having the staircase shape where the second portion in which the interconnections extends in the second direction orthogonal to the first direction and the first portion in which the interconnections extends in the first direction are alternately connected in the second interconnection layer 20E, even the interconnections formed in the third interconnection layer 30E extend in the direction orthogonal to the first direction.

Consequently, in this embodiment, the area of the sterically overlapping portions between the interconnections in the first interconnection layer 10E and the interconnections in the second interconnection layer 20E, which are mainly used as the signal lines and the power source supply lines, are reduced so that the coupling capacitance is suppressed. Then, it is possible to reduce the noises contained in the signals transmitted through the interconnections in the respective interconnection layers and to prevent in advance the multi-layer interconnection semiconductor integrated circuit from the erroneous operation.

In this embodiment, in particular, the interconnections formed in the third interconnection layer 30E extend along the direction orthogonal to the first direction. Thus, similarly to the first embodiment, the space for the electric connection between the circuit blocks 60 installed on the third interconnection layer 30E and the interconnections formed in the third interconnection layer 30E is adequately preserved. Also, through the via holes, the interconnections formed in the third interconnection layer 30E electrically connect the ends located at both ends in the direction orthogonal to the first direction of the interconnections formed in the second interconnection layer 20E. Hence, even if each of the interconnections formed in the second interconnection layer 20E is formed as the staircase interconnection shape in which the second portion having interconnections extends in the second direction orthogonal to the first direction and the first portion having interconnections extends in the first direction are alternately connected, it is possible to prevent the size in the direction orthogonal to the first direction of the area occupied by the interconnections formed on the second interconnection layer 20E from being enlarged and consequently the area occupied by the interconnection layers can be suppressed.

Next, the semiconductor device according to the third embodiment of the present invention is explained. The semiconductor device according to the third embodiment of the present invention is provided with: any one of the multi-layer interconnection semiconductor integrated circuits noted in the first embodiment and the second embodiment; a signal input unit for inputting signals to an interconnection of the first, second or third interconnection layers defined as the signal interconnection in the multi-layer interconnection semiconductor integrated circuit; and a power source unit for supplying a power source to an interconnection of the first, second and third interconnection layers defined as the signal interconnection in the multi-layer interconnection semiconductor integrated circuit.

The semiconductor device according to this embodiment, since containing the multi-layer interconnection semiconductor integrated circuit noted in the first or second embodiment, can suppress the noise to the transmission signal, which is caused by the coupling capacitance between the interconnections formed on the adjacent interconnection layers in the multi-layer, and prevent in advance the semiconductor device from erroneous operations. In addition, the substrate size of the multi-layer interconnection semiconductor integrated circuit contained in the semiconductor device can be suppressed. As a result, the erroneous operation can be prevented while keeping the size of the semiconductor device small.

What is claimed is:

1. A semiconductor device comprising:
a multi-level wiring structure comprising a first-level wiring layer, a second-level wiring layer and a third-level wiring layer, the second-level wiring layer being between the first-level wiring layer and the third-level wiring layer;
a first interconnection line formed as the first-level wiring layer and extending in a first direction;
a second interconnection line formed as the second-level wiring layer and extending to cross over the first interconnection line, the second interconnection line thereby having a first portion and a second portion which are located respectively on first and second sides opposite to each other with respect to the first interconnection line, the first and second portions being distant form each other in the first direction; and
a third interconnection line formed as the third-level wiring layer and extending to cross over the first interconnection line, the third interconnection line thereby having a third portion and a fourth portion which are located respectively on the first and second sides with respect to the first interconnection line:
the second portion of the second interconnection line being connected through a via to the third portion of the third interconnection line on the second side with respect to the first interconnection line.

2. The device as claimed in claim 1, wherein the second interconnection line extends in a second direction different from and non-orthogonal to the first direction, the third interconnection line extends in a third direction substantially orthogonal to the first direction, and the device further comprises a fourth interconnection line formed as the second-level wiring layer, the fourth interconnection line having a fifth portion connected through a via to the fourth portion of the third interconnection line on the first side with respect to the first interconnection line and extending in the second direction from the fifth portion.

3. The device as claimed in claim 1, wherein the second interconnection line extends in a second direction different from and non-orthogonal to the first direction, the third interconnection line extends in a third direction different from each of the first and second directions and non-orthogonal to the first direction, and the fourth portion of the third interconnection line being distant each of the first and second portions of the second interconnection line in the second direction.

4. The device as claimed in claim 3, further comprising a fourth interconnection line formed as the second-level wiring layer, the fourth interconnection line having a fifth portion connected through a via to the fourth portion of the third interconnection line on the first side with respect to the first interconnection line and extending in the second direction from the fifth portion.

5. The device as claimed in claim 1, wherein each of the first and second portions of the second interconnection line extends in the first direction and the second interconnection line further has a sixth portion extending in a direction substantially orthogonal to the first direction and crossing over the first interconnection line to connect the first and second portions to each other.

6. The device as claimed in claim 5, wherein the third interconnection line extends in a direction substantially orthogonal to the first direction and the device further comprises a forth interconnection line formed as the second-level wiring layer, the fourth interconnection line being connected through a via to the fourth portion of the third interconnection line on the first side with respect to the first interconnection line.

7. The device as claimed in claim 6, wherein the fourth interconnection line extends in the first direction, then bending in a direction substantially orthogonal to the first direction and further bending again in the first direction.

8. The device as claimed in claim 7, further comprising a plurality of fifth interconnection lines each formed as the first wiring layer and each extending in the first direction, the third interconnection line further crossing over each of the plurality of fifth interconnection lines.

9. The device as claimed in claim 1, further comprising a plurality of fifth interconnection lines each formed as the first wiring layer and each extending in the first direction, the third interconnection line further crossing over each of the plurality of fifth interconnection lines.

10. The device as claimed in claim 2, further comprising a plurality of fifth interconnection lines each formed as the first wiring layer and each extending in the first direction, the third interconnection line further crossing over each the plurality of fifth interconnection lines.

11. The device as claimed in claim 3, further comprising a plurality of fifth interconnection lines each formed as the first wiring layer and each extending in the first direction, the third interconnection line further crossing over each the plurality of fifth interconnection lines.

12. The device as claimed in claim 4, further comprising a plurality of fifth interconnection lines each formed as the first wiring layer and each extending in the first direction, the third interconnection line further crossing over each the plurality of fifth interconnection lines.

* * * * *